United States Patent [19]

O'Loughlin

[11] Patent Number: 4,792,732
[45] Date of Patent: Dec. 20, 1988

[54] RADIO FREQUENCY PLASMA GENERATOR

[75] Inventor: James P. O'Loughlin, Albuquerque, N. Mex.

[73] Assignee: United States of America as represented by the Secretary of the Air Force, Washington, D.C.

[21] Appl. No.: 60,881

[22] Filed: Jun. 12, 1987

[51] Int. Cl.$^4$ ............................................. H01J 1/00
[52] U.S. Cl. ..................................... 315/334; 315/34; 315/39; 315/59; 315/169.1; 315/194; 315/248; 315/111.21; 313/581; 313/606; 313/607; 313/621; 313/231.31; 313/307
[58] Field of Search ................ 343/797, 720, 844; 315/111.21, 248, 267, 39, 34, 59, 169.1, 194; 313/230, 234, 231.31, 231.71, 307, 607, 606, 621; 250/423 F

[56] References Cited

U.S. PATENT DOCUMENTS

| | | | |
|---|---|---|---|
| 2,530,818 | 11/1950 | Fox | 343/797 |
| 2,616,046 | 10/1952 | Marston et al. | 343/844 |
| 3,022,236 | 2/1962 | Ulrich et al. | 204/154.2 |
| 3,418,206 | 12/1968 | Hall et al. | 176/2 |
| 3,541,372 | 11/1970 | Omura et al. | 313/63 |
| 3,663,858 | 5/1972 | Lisitano | 315/39 |
| 3,665,245 | 5/1972 | Schwarz | 315/111 |
| 3,873,884 | 3/1975 | Gabriel et al. | 315/267 |
| 3,984,727 | 10/1976 | Young | 315/248 X |
| 4,389,593 | 6/1983 | De Santis et al. | 315/4 |

Primary Examiner—David K. Moore
Assistant Examiner—Mark R. Powell
Attorney, Agent, or Firm—Donald J. Singer; Richard J. Donahue

[57] ABSTRACT

A plasma generator for exciting electrons in the plasma to a uniform energy level. In a perferred embodiment, two sets of mutually perpendicular electrodes surround a container of gas, with one set being driven through a ninety degree phase shifter to establish a circularly polarized field in the space within the container. Alternative means are disclosed for launching circularly polarized RF waves into the container of gas. A desired level of uniform electron energy is achieved by establishing the proper relationship between the frequency and magnitude of the applied circularly polarized field and the mean free path of the electrons in the plasma.

5 Claims, 4 Drawing Sheets

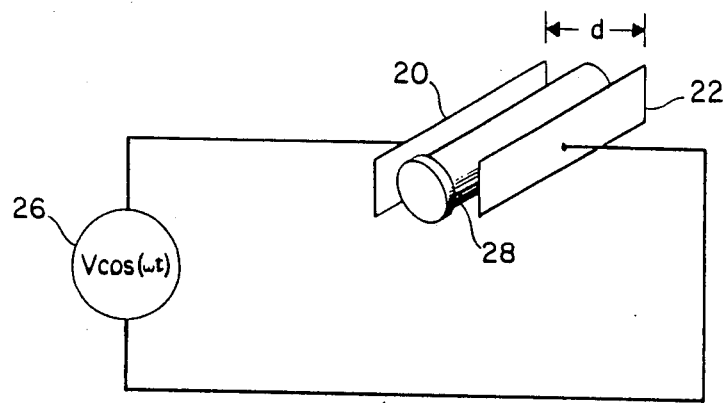
Fig. 1 (PRIOR ART)
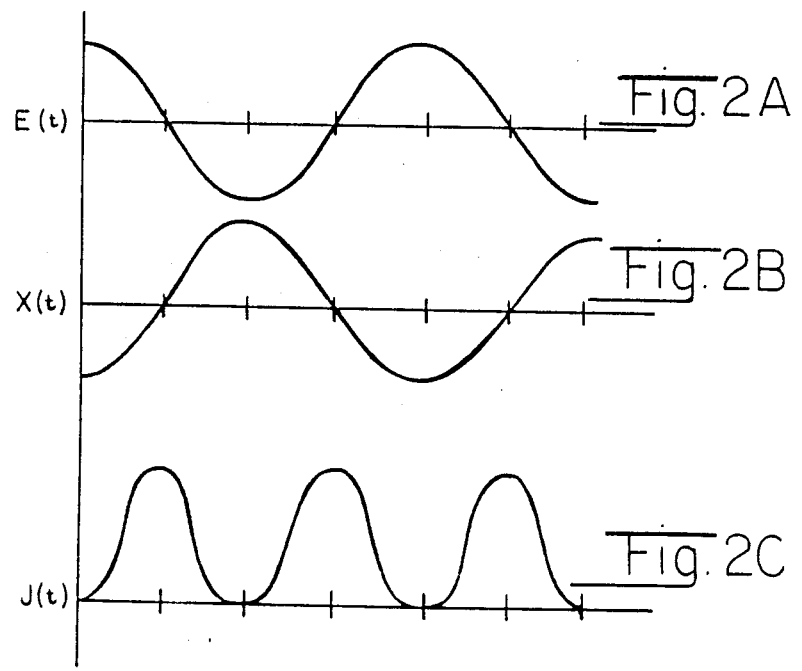
Fig. 2A
Fig. 2B
Fig. 2C

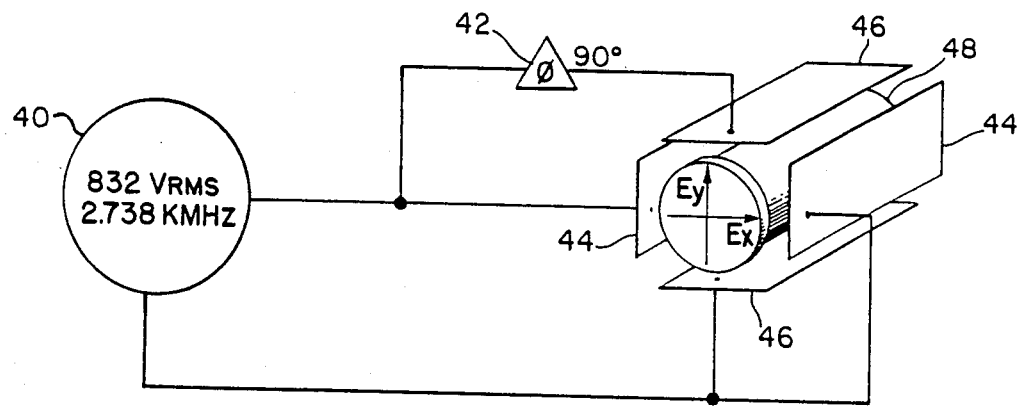
Fig. 3
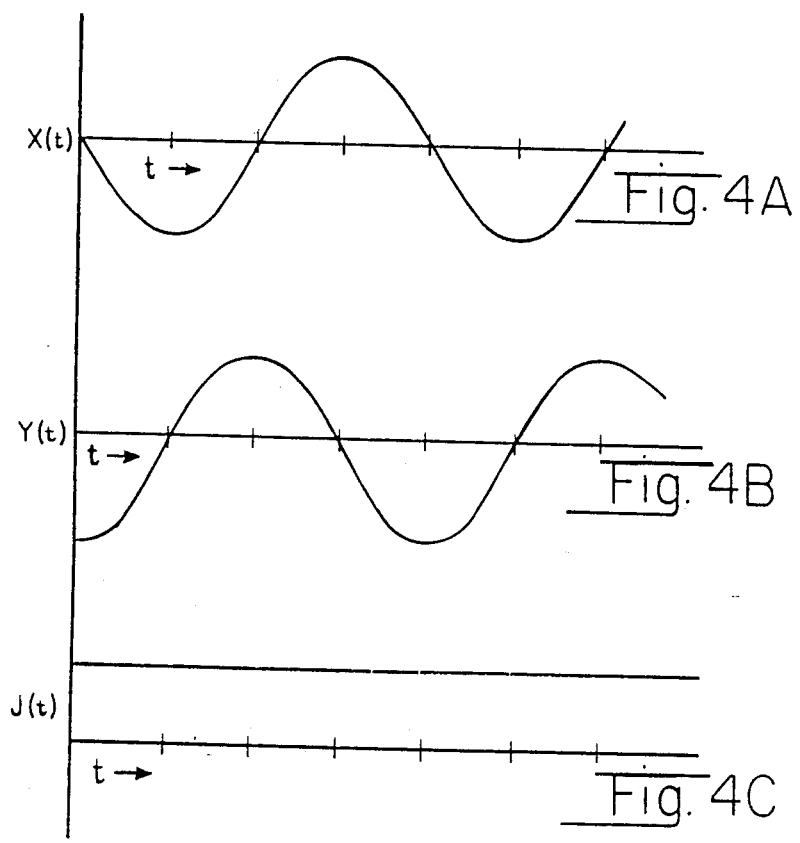
Fig. 4A
Fig. 4B
Fig. 4C

RADIO FREQUENCY PLASMA GENERATOR

STATEMENT OF GOVERNMENT INTEREST

The invention described herein may be manufactured and used by or for the Government for governmental purposes without the payment of any royalty thereon.

BACKGROUND OF THE INVENTION

This invention relates in general to plasma generators, and more particularly to a radio frequency plasma generator capable of exciting electrons to a uniform energy level. The term "plasma" is intended herein to mean a neutral plasma, i.e., a collection of positive, negative and neutral particles having a total net charge substantially equal to zero.

There are numerous applications of plasma discharges, such as for plasma etching, sputtering, etching by chemically active discharges, generating excited and/or metastable states for lasers, generating black body (flash lamp) or fluorescent light, and various other applications. The generation of such plasmas may be accomplished in several ways, such as by the bombardment of a gas with high energy electrons, by the application of direct current or alternating current (radio frequency or microwave) electric fields to a gas, by the elevation of the temperature of a gas (by any means) to the region of thermal ionization, by the ionization of the gas by photons, and by subjecting the gas to radioactive materials.

In many applications, especially those for generating excited states for lasers, the desired or useful excitation process involves the transfer of a very precise amount of energy corresponding to the quantum level of the reaction. With the exception of narrow band photon sources, the energy sources presently available to drive the lasing process have a broad random energy distribution, and only the energy within the narrow range which drives the desired process is of any use. Furthermore, the energy outside the useful range can cause undesirable reactions. Also, even though narrow band photon sources may drive a process at the proper energy level, such photon sources are either lasers or otherwise very power and efficiency limited, and are therefore not practical for high power applications.

OBJECTS AND SUMMARY OF THE INVENTION

It is therefore the primary object of the present invention to provide apparatus for generating a volume of plasma within which electrons are excited to a precise uniform energy level.

In accordance with the present invention, the electrons in a plasma are excited to a precise uniform energy level by means of a circularly polarized electric field of a specified frequency and magnitude. In the preferred embodiment of the invention, two sets of mutually perpendicular electrodes envelop a container of a gas, such as Xenon. The sets of electrodes are driven from the same RF (radio frequency) source, with one set being driven through a ninety degree phase shifter. A resultant circularly polarized field of a precise frequency and magnitude is formed in the space in the container to excite the electrons in the gas to a precise and uniform energy level.

BRIEF DESCRIPTION OF THE DRAWINGS

The foregoing and other objects, advantages and features of the present invention will become apparent from the following detailed description of the preferred embodiment thereof, as illustrated in the accompanying drawings, in which:

FIG. 1 is a schematic diagram of a plasma generator having a linearly polarized RF field-producing apparatus commonly used in the prior art;

FIGS. 2A, 2B and 2C depict the electric field, electron motion and electron energy versus time waveforms respectively provided by the prior art apparatus of FIG. 1;

FIG. 3 is a schematic illustration of a plasma generator constructed in accordance with the preferred embodiment of the present invention;

FIGS. 4A, 4B and 4C depict the motion and energy of an electron in the plasma generator of FIG. 3;

DESCRIPTION OF THE PREFERRED EMBODIMENT

Figure 5:
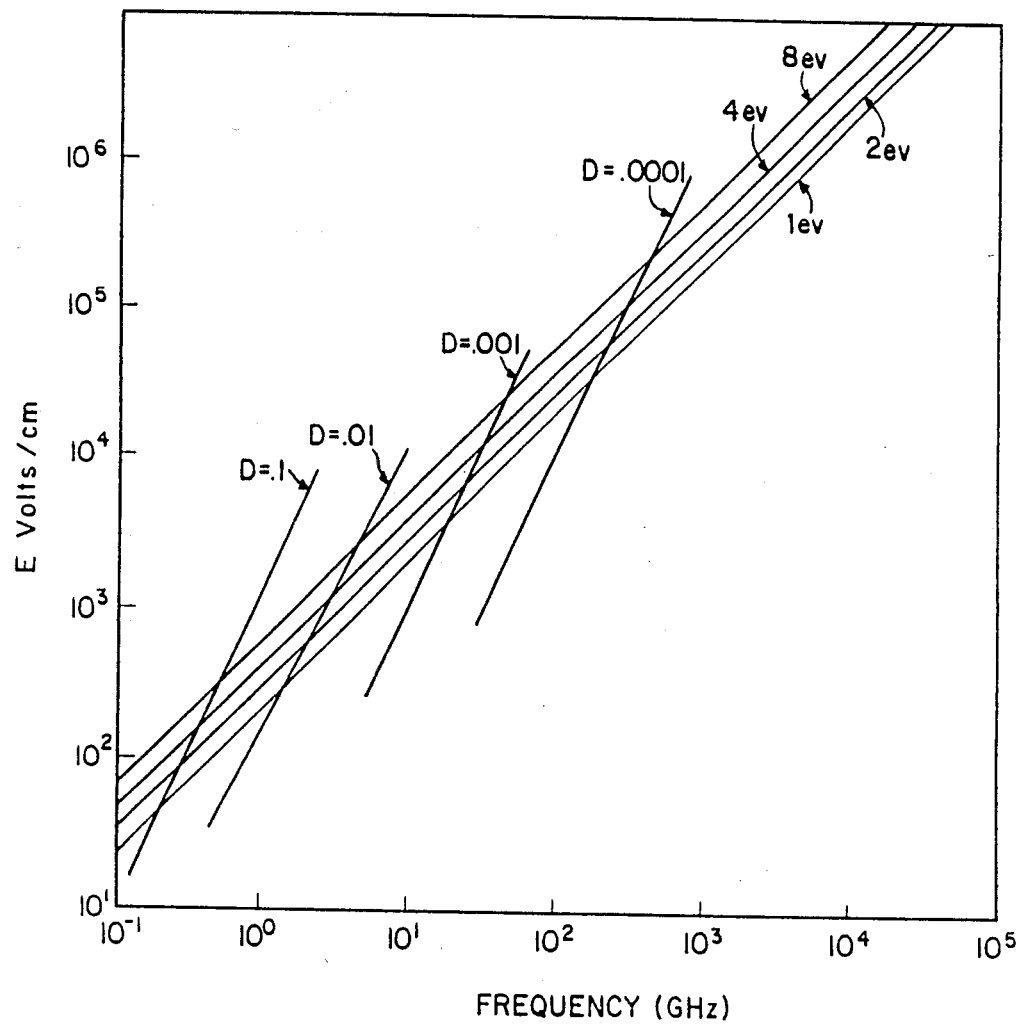
FIG. 5 is a graph which depicts the electric field versus frequency response for different orbit diameters and electron energies of an electron subjected to the circularly polarized electric field of the present invention.

As indicated earlier, radio frequency (RF) or microwave fields have been commonly used for many years for exciting electrons to generate a plasma. However, such RF and microwave excitation has been applied with linear polarization which results in inducing an harmonic motion of the electrons. Prior art apparatus which provides such linear electric field polarization is depicted schematically in FIG. 1 where an electric field E(t) is produced between a pair of electrode plates 20 and 22. A source of RF energy 26 is applied across electrodes 20 and 22 which are positioned on opposite sides of a container 28 of gas. Electrodes 20 and 22 are separated by a distance d.

The electric field established across plates 20 and 22 is given by:

$$E(t) = E_x \cos(\omega t). \quad (1)$$

In the absence of any collisions, the electrons in such a field will move according to $$X(t) = (eE_x) \cos(\omega t)/(\omega^2 m) \quad (2)$$

where: $E_x$ = the x components of the electric field (y and z components being zero)
$\omega$ = the frequency of the field (radians per second)
t = time
m = mass of an electron (9.1 E-31 kg)

The energy of the electron is also time dependent and is given by:

$$J(t) = (eE \sin(\omega t)/\omega^2/(2m) \quad (3)$$

FIGS. 2A, 2B and 2C depict the electric field E(t), electron motion X(t) and electron energy J(t) as a function of time with the linear polarization concept and circuitry discussed above. As shown in FIG. 2C, the electron energy varies with time from zero to a peak value and therefore only spends a fraction of the time at any particular level which may be optimum for the desired reaction with the gas molecules. Most collisions which occur at other energy levels will produce results which are of no value. The rate at which collisions occur is measured by the mean free path (mfp) in the plasma and is given by:

$$mfp = 1/(qN) \qquad (4)$$

where: q = the cross-section of the gas molecule
N = the number density of the gas molecules In general, the cross-section of the gas molecule depends upon the energy of the electron, so the accurate evaluation of mfp requires consideration of this energy. Also, the mfp itself is an average statistical value. The value of mfp indicates what field strengths and frequencies will give what results. For example, for a low N value and long mfp value, if a high frequency is used, the peak excursions of the electrons will be small as compared to the mfp, and not many collisions will occur for low fields. If the field is increased, the collision rate will increase because the excursion can be made large compared to the mfp. The important thing to recognize is that under any circumstances, the collisions are random so the energy at the time of collision is random. This is true even with a zero frequency or d.c. field. It should also be recognized that if the electrons could be established at a steady kinetic energy level throughout the plasma volume, then the energy at the time of a collision would be the same, even though the spatial and temporal occurance of the colision is random. It is a fact that even with the electron at the same predetermined and optimum energy, the outcome of the collision is still a statistical event; however, the yield of such a collision will be much higher than where the energy level is random.

The present invention provides for the manner in which an RF field is applied to a plasma to establish electrons at a particular energy level throughout the plasma volume. As seen in FIG. 3 of the drawings, the preferred apparatus comprises an RF source 40, a 90 degree phase shifter 42, two sets of mutually perpendicular electrodes 44 and 46, and a container 48 for a gas, such as Xenon. The sets of etelectrodes 44 and 46, which may be metallic plates, are positioned adjacent the exterior of container 48 which is preferably of tubular shape and made of quartz. The sets of electrodes 44 and 46 are driven from the same RF source 40, with set 46 being driven through 90 degree phase shifter 42.

The electric field established across gas container 48 comprises two components: an electric field $E_x$ across electrode set 44 and an electric field $E_y$ across electrode set 46. The $E_x$ and $E_y$ fields are at right angles to each other and are also ninety degrees out of phase with one another. The net field therefore is circularly polarized in the x-y plane.

Such a net field can be expressed by the equation:

$$E(t) = E_x \sin(\omega t) + jE_y \cos(\omega t) \qquad (5)$$

where $E_x = E_y = E_x =$ Amplitude (constant)
The corresponding force equations are:

$$m(dV_x/dt) = eE_s \sin(\omega t) \qquad (6)$$

$$m(dV_y/dt) = eE_s \cos(\omega t) \qquad (7)$$

and the x and y solutions which are shown graphically in FIGS. 4A and 4B are:

$$X(t) = (eE_s \sin(\omega t))/(\omega^2 m) \qquad (8)$$

$$Y(t) = (eE_s \cos(\omega t))/(\omega^2 m) \qquad (9)$$

This is a circular orbit with a radius = $(eE_s/(\omega^2 m))$. The speed is constant and also the energy is constant. This constant energy is depicted in FIG. 4C of the drawings and may be expressed by the equation:

$$J = 0.5(eE_x/\bullet)^2/m \qquad (10)$$

Relativistic effects and small thermal perturbations have not been included but this does not affect the principles nor the accuracy of the above equations to any significant degree.

Thus it is shown to be possible to use RF fields to excite electrons to a constant energy level. In the specific example which follows, it will be seen that the field strength, frequencies and number densities lie within achievable ranges of practical interest and value.

In a specific example of the operation of the apparatus of the present invention, it was desired to enhance the output of the Xenon lamp at 3000 degrees angstrom by pumping the electrons in the Xenon plasma at an energy corresponding to that wavelength, i.e., at about 6.624E-19 joules (4.11 ev). The Xenon in the container was established at 1 Torr (STP) or at a number density of 3.54E16/cc. The total cross section of Xenon was about 2E-15 square centimeters so that the mfp was about 0.014 centimeters. The electrodes of each set were separated by one centimeter.

The mfp was set equal to the diameter of the electron orbit such that:

$$E_s/\omega^2 = 0.5(m \, mfp)/e \qquad (11)$$

and also:

$$E_s^2/\omega^2 = (2Jm)/e^2 \qquad (12)$$

Solving for the required field strength and frequency:
$E_s = 1177$ volts/cm
$\omega = 1.72E10 = 2.738$ kMHz Both of these values are practical as they stand but also represent worst case numbers which are supported by the following argument. First, it should be noted that both $E_s$ and $\omega$ are inversely dependent on the mfp:

$$E_s = (4J)/e \, mfp \qquad (13)$$

$$\omega = SQRT(8J/m)mfp \qquad (14)$$

The mfp used was based on the case where the electron motion was not confined to a circular orbit but runs in a linear path. Therefore a linearly traveling electron would have a certain chance of collision traveling one such diameter. However, if it has no collision, it continues on into new territory at the same speed until it finds a gas molecule to collide with. This is not so for the orbiting electron. It continues around and around the same path waiting for a gas molecular to come to it. Since electrons travel much faster than molecules, typically hundreds of times faster, it should be expected that both the electric field and frequency would have to be reduced considerably from the values calculated using the linear mfp in order for the rate of collisions to be the same for the linear and orbital electrons of the same energy.

This is desirable for several reasons. For a given molecular density, the lower field strength and frequency are both easier to generate and apply to a gas; or for the same field strength and frequency, it is possible to operate at much higher molecular densities which extends the range of operation in comparison to the linear type of excitation. The precise amount of the effect cannot be predicted with great confidence because of the interaction of several statistical processes, but it is a definite advantage in addition to the main motivation of establishing the electron population at a uniform energy level. The optimum reduction of field strength and frequency is perhaps best determined experimentally.

The graph of FIG. 5 depicts calculted plots of electric field strength in volts per centimeter versus frequency in gigahertz for various electron energy values and orbit diameter values of an electron subject to the circularly polarized electric field formed by the plasma generator of the present invention.

Figure 6:
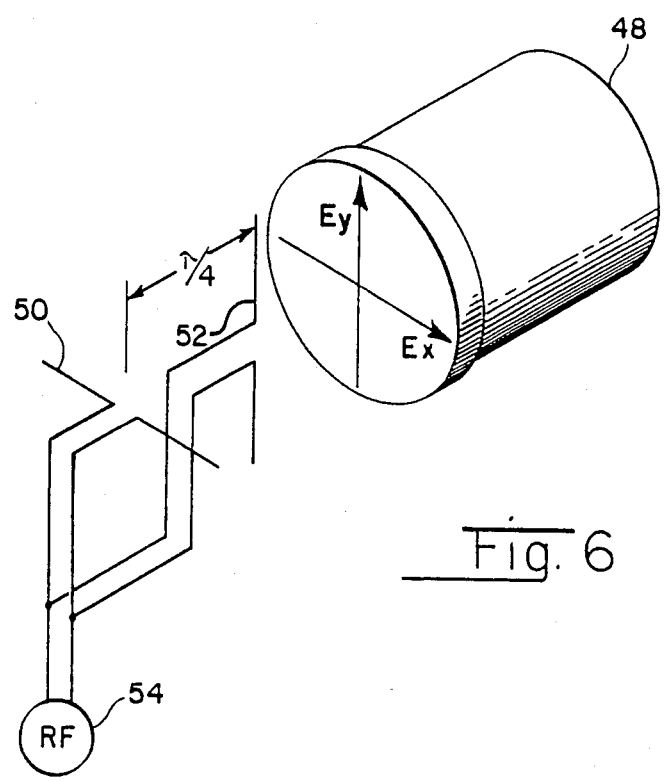
FIG. 6 is an illustration of another embodiment of the present invention.

FIG. 6 illustrates an alternative embodiment of the plasma generator of the present invention. Instead of utilizing pairs of electrode plates for generating the circularly polarized field, circularly polarized waves may also be launched into container 48 from an antenna consisting of a pair of dipoles 50 and 52 which are driven from the same RF source 54 and spaced a quarter wavelength apart. Dipoles 50 and 52 are each driven directly from RF source 54.

Figure 7:
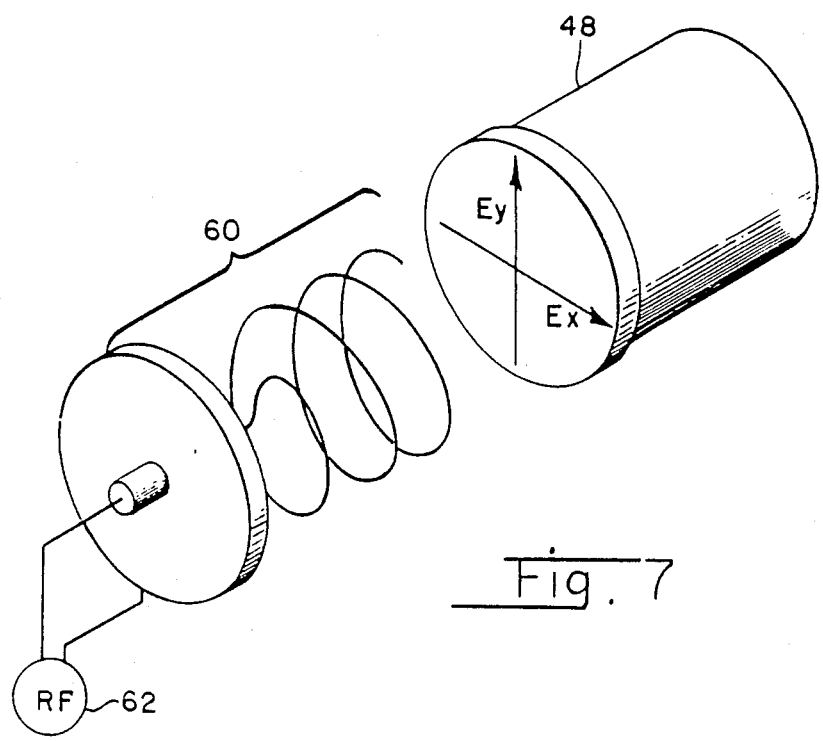
FIG. 7 is an illustration of yet another embodiment of the present invention.

FIG. 7 illustrates yet another alternative embodiment of the plasma generator of the present invention. In this embodiment, the circularly polarized wave is formed and launched into container 48 by a helical antenna 60 driven by an RF source 62. Helical antenna 60 may have either a right-handed or left-handed spiral.

Although the invention has been described with reference to a particular embodiment thereof, it will be understood to those skilled in the art that the invention is capable of a variety of alternative embodiments that come within the spirit and scope of the appended claims.

What is claimed is:

1. A plasma generator comprising:
   a container for containing a gaseous material;
   an RF generator;
   circularly-polarized field producing means coupled to said RF generator and introducing a circularly-polarized electric field within said container to form a neutral plasma within said container;
   said neutral plasma having a predetermined and substantially uniform electron energy level established throughout the interior volume of said container;
   said uniform electron energy level being established by the magnitude and frequency of said circularly-polarized electric field being related in accordance with a first equation:

$$J=0.5(eE_s/\omega)^2/m$$

where:
   J = said uniform electron energy level in joules,
   $E_s$ = the magnitude of said electric field in volts per meter,
   $\omega$ = the frequency of said electric field in radians per second,
   m = the electron mass in kilograms,
   and e = the electron charge in coulombs;
   and by the mean free path of electrons in said neutral plasma being determined in accordance with a second equation:

$$mfp \geq 4J/eE_s$$

where:
   mfp = the mean free path of electrons in said neutral plasma in meters,
   J = said uniform electron energy level in joules,
   and e = said electron charge in coulombs.

2. A plasma generator as defined in claim 1 wherein said circularly-polarized field producing means comprises:
   a phase shifter means;
   a first and a second set of electrodes disposed about said container and being mutually perpendicular about said container;
   means for directly coupling said RF generator to said first set of electrodes; and
   means for serially coupling said RF generator and said phase shifter means across said second set of electrodes.

3. A plasma generator as defined in claim 1 wherein said circularly-polarized field producing means comprises:
   a first and a second dipole antenna disposed adjacent said container, said first and said second dipole antenna being mutually perpendicular and being spaced by a quarter of the wavelength of the frequency of said RF generator; and
   means for directly coupling said RF generator to said first dipole antenna and to said second dipole antenna.

4. A plasma generator as defined in claim 1 wherein said circularly-polarized field producing means comprises:
   a helical antenna disposed adjacent said container and coupled to said RF generator.

5. A method for generating a neutral plasma having a uniform electron energy level throughout said plasma comprising the steps of:
   enclosing a gaseous material within a container;
   forming a circularly polarized electric field within said container;
   relating the electron energy level to the magnitude to said electric field and the frequency to said electric field in said plasma by adjusting paid magnitude and said frequency in accordance with a first equation:

$$J=0.5(eE_s/\omega)^2/m$$

where:
   J = said uniform electron energy level in joules,
   $E_s$ = the magnitude of said electric field in volts per meter,
   $\omega$ = the frequency of said electric field in radians per second,
   m = the electron mass in kilograms,
   and e = the electron charge in coulombs;
   and further relating said electron energy level, said magnitude of said electric field and the mean free path of electrons in said plasma in accordance with a second equation:

$$mfp \geq 4J/eE_s$$

where:
mfp = the mean free path of electrons in said neutral plasma in meters,
J = said uniform electron energy level in joules,
e = said electron charge in coulombs, and
$E_s$ = said magnitude of said electric field in volts per meter.

* * * * *